United States Patent [19]

Goiffon et al.

[11] 4,400,858
[45] Aug. 30, 1983

[54] HEAT SINK/RETAINER CLIP FOR A DOWNHOLE ELECTRONICS PACKAGE OF A MEASUREMENTS-WHILE-DRILLING TELEMETRY SYSTEM

[75] Inventors: John J. Goiffon, Grapevine; S. Tom Thawley, Dallas, both of Tex.

[73] Assignee: Tele-Drill Inc,, Richardson, Tex.

[21] Appl. No.: 229,795

[22] Filed: Jan. 30, 1981

[51] Int. Cl.³ .................. A44B 21/00; F16L 35/00; H02B 1/04
[52] U.S. Cl. ............................ 24/255 BS; 24/257; 24/256; 361/386; 138/108; 165/80 R
[58] Field of Search ............. 24/3 J, 3 L, 106, 108, 24/112, 155 C, 155 RB, 211 R, 216, 256, 259 R, 255 BS, 257; 165/177, 178, 179, 80 B, 80 R, 80 C, 185; 248/65, 49; 361/386, 395, 399; 138/108

[56] References Cited

U.S. PATENT DOCUMENTS

| | | | |
|---|---|---|---|
| 2,325,616 | 8/1943 | Landweber | 138/108 |
| 2,876,277 | 3/1959 | Badger et al. | 174/52 R |
| 3,258,649 | 6/1966 | Arguin et al. | 317/101 |
| 3,337,775 | 8/1967 | Scoles | 361/386 |
| 3,784,885 | 1/1974 | Weidermann | 165/80 C |
| 4,149,219 | 4/1979 | Kraft | 361/386 |
| 4,184,539 | 1/1980 | Rein | 361/386 |
| 4,353,108 | 10/1982 | Chippel | 361/386 |

FOREIGN PATENT DOCUMENTS 45801 of 1911 Austria .................. 24/112

*Primary Examiner*—Gene Mancene
*Assistant Examiner*—John Weiss
*Attorney, Agent, or Firm*—John J. Byrne; Bradford E. Kile

[57] ABSTRACT

A heat sink/retainer clip (54) capable of resiliently holding objects, such as printed circuit boards, in tubular members, such as telemetering tools. The heat sink/retainer clip comprises two portions (56, 60) which extend across the tube from opposite sides thereof and two portions (58, 62) which engage the inner periphery of a tube (48). The clip is made of a resilient material, and the outer radii of the second two portions is slightly greater than the inner radius of the tube, so that the clip is distorted by the tube, during assembly, to resiliently grip the object between the first two portions.

11 Claims, 3 Drawing Figures

HEAT SINK/RETAINER CLIP FOR A DOWNHOLE ELECTRONICS PACKAGE OF A MEASUREMENTS-WHILE-DRILLING TELEMETRY SYSTEM

BACKGROUND OF THE INVENTION

This invention comprises a retainer clip adapted to hold a first object in position inside a second object, such as a tube or conduit, which has a circular cross-section. More specifically, the invention relates to a heatsink/retainer member operable to support electronic circuit boards within the interior of a toroidal coupled measurements-while-drilling (MWD) telemetry tool.

In the oil industry, the incentives for making downhole measurements during drilling operations are substantial. In this connection, downhole measurements while drilling will allow safer, more efficient, and more economic drilling of both exploration and production wells.

Continuous monitoring of downhole conditions will allow immediate response to potential well control problems. This will allow better mud programs and more accurate selection of casing seats, possibly eliminating the need for an intermediate casing string, or a liner. It also will eliminate costly drilling interruptions while circulating to look for hydrocarbon shows at drilling breaks, or while logs are run to try to predict abnormal pressure zones.

Drilling will be faster and cheaper as a result of real time measurement of parameters such as bit weight, torque, wear and bearing condition. Faster penetration rate, better trip planning, reduced equipment failures, delays for directional surveys, and elimination of a need to interrupt drilling for abnormal pressure detection, could lead to a 5 to 15% improvement in overall drilling rate.

In addition, downhole measurements while drilling may reduce costs for consumables, such as drilling fluids and bits, and may even help avoid setting pipe too early. Were MWD to allow elimination of a single string of casing, further savings could be achieved since smaller holes could be drilled to reach the objective horizon. Since the time for drilling a well could be substantially reduced, more wells per year could be drilled with available rigs. The savings described would be free capital for further exploration and development of energy resources.

In addition to the above knowledge of subsurface formations will be improved. Downhole measurements while drilling will allow more accurate selection of zones for coring, and pertinent information on formations will be obtained while the formation is freshly penetrated and least affected by mud filtrate. Furthermore, decisions regarding completing and testing a well can be made sooner and more competently.

In order to accomplish the foregoing objectives of making downhole measurements and transmitting the information to the surface, it is necessary to insert and suspend a telemetering tool comprising a relatively long tubular casing concentrically within a drill collar. Electronic packages within the tubular telemetering tool such as converters, micro-processors, modulators, power amplifiers, etc. are mounted on generally square or rectangular printed circuit boards. These boards must then be securely suspended within the interior of the tubular tool and thus isolated from drilling mud within the drill collar.

In the past securing of square or rectangular objects in a tubular package was typically accomplished by drilling holes in the object and securing it with screws to a piece of material the size of the object. This secondary piece then fit inside the tubular package. This technique was quite costly and time consuming, and it had a tendency to translate outside shock and vibration directly to the object inside the tubular package. It will be appreciated by those skilled in the art that a drill collar of an operating rig is subject to considerable vibration and shock forces as the drill string penetrates through the earth.

Another technique utilized was to cut grooves inside the tubular package. The grooves were designed to have a width and length compatible with the object to be packaged and served to suspend the object. This required precision cutting inside a tubular member which, in the case of a telemetry tool, may be only an inch or so in diameter. Because of such size constraints, this technique was only feasible for axially short objects. Additionally, suspension systems using this technique were often structurally suspect.

The electronic components within a telemetering tool generate a degree of heat, often in concentrated zones. It would be highly desirable to be able to dissipate such heat concentrations within an electronic package of a telemetering tool.

The difficulties suggested in the preceding are not intended to be exhaustive, but rather are among many which may tend to reduce the effectiveness of prior heat sink/retainer members. Other noteworthy problems may also exist; however, those presented above should be sufficient to demonstrate that heat sink/retainer members appearing in the past will admit to worthwhile improvement.

OBJECTS OF THE INVENTION

It is therefore a general object of the invention to provide a novel heat sink/retainer apparatus which will obviate or minimize difficulties of the type previously described.

It is a particular object of the invention to provide a novel retainer clip for electronic circuit boards which will synergistically serve to dissipate heat concentrations on the circuit boards.

It is a particular object of the invention to provide a novel heat sink/retainer clip which will permit facile mounting of square or rectangular objects in relatively small tubular packages.

It is another object of the invention to provide a novel heat sink/retainer clip which will provide secure mounting capability of square or rectangular objects in tubular packages while concomitantly providing shock-resistance and vibration-resistance capabilities.

BRIEF SUMMARY OF THE INVENTION

A heat/sink retainer clip according to a preferred embodiment of the invention comprises two portions which extend across a tubular member from opposite sides thereof and two portions which engage the inner periphery of the tubular member. The subject clip is formed from a resilient material, and the outer radii of curvature of the second two portions are slightly greater than the inner radius of the tube, so that the clip is distorted by the tube to grip the object to be held between the first two portions.

A retainer clip according to this invention damps shock and vibration to which the tubular package is subjected. It also functions both as a heat sink itself and as a heat conducting unit through which heat may be conducted from the suspended object to the surrounding tubular package.

BRIEF DESCRIPTION OF THE DRAWINGS

Other objects and advantages of the present invention will become apparent from the following detailed description of a preferred embodiment thereof taken in conjuncion with the accompanying drawings, wherein.

DETAILED DESCRIPTION

Figure 1:
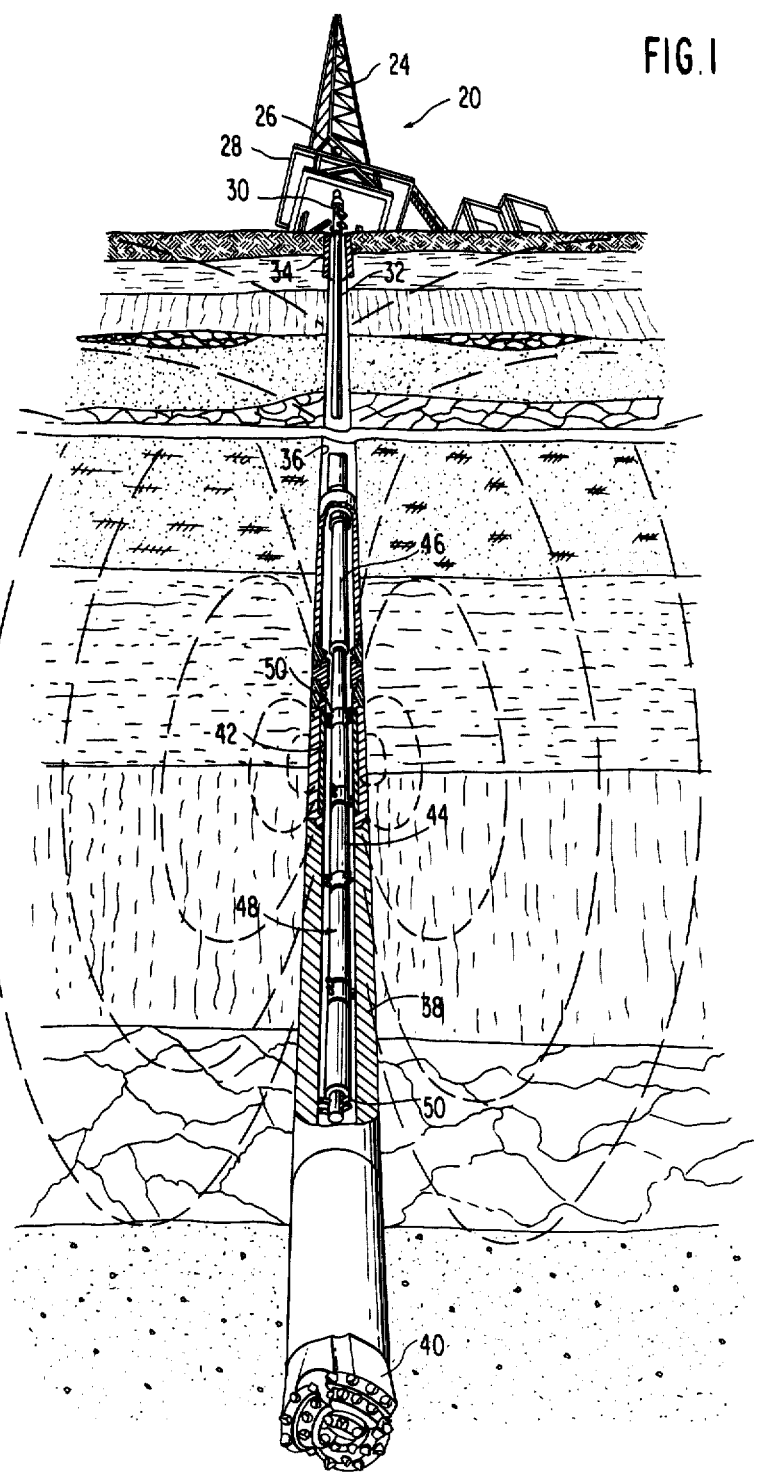
FIG. 1 is a perspective view from the downhole end of a drill string disclosing a drill collar and a toroidally coupled MWD system for continuously telemetering real time data to the surface.

Referring now to the drawings, wherein like numerals indicate like parts, there will be seen a general view of a toroidal coupled, MWD telemetry system in which the subject invention has particular application and detail views of a preferred embodiment of a heat sink/retainer clip in accordance with the subject invention.

CONTEXT OF THE INVENTION

Before providing a detailed description of the subject invention, it may be worthwhile to outline the context in which the instant invention was developed and has particular utility. In this connection and with reference to FIG. 1, there will be seen a conventional rotary rig 20 operably positioned to drill a bore hole through variant earth strata. The rotary rig 20 includes a mast 24 of the type operable to support a traveling block 26 and various hoisting equipment. The mast is support upon a substructure 28 which straddles annular and ram blowout preventors 30. Drill pipe 32 is lowered from the rig through surface casing 34 and into a borehole 36. The drill pipe 32 extends through the bore hole 36 to a drill collar 38 which is fitted at its distal end with a conventional drill bit 40. The drill bit 40 is rotated by the drill pipe or a subsurface motor and penetrates through the earth strata.

The drill collar 38 provides weight on the drill bit 40 and facilitates bit penetration. Such drill collars typically are composed of thick side walls and are subject to severe tension, compression, torsion, column bending, vibration and jarring loads. The drill collar 38 further serves to house a data transmit toroid 42 comprising a core for windings of a downhole data telemetering system. Finally, the drill collar 38 also functions as a support to hang a centrically suspended telemetering tool 44 operable to detect and transmit downhole data to the surface concomitantly with normal operation of the drilling equipment.

The telemetering tool 44 is composed of a number of tubular sections in series. More specifically, a battery pack 46 is followed by sensing and data electronics transmission sections 48 which are concentrically maintained and electrically isolated from the interior of the drill collar 38 by a plurality of radially extending fingers 50 composed of a resilient dielectric material.

The subject invention is directed to a heat sink/retainer clip operable to mount printed circuit boards within the electronics transmission sections 48.

HEAT SINK/RETAINER CLIP

Figure 2:
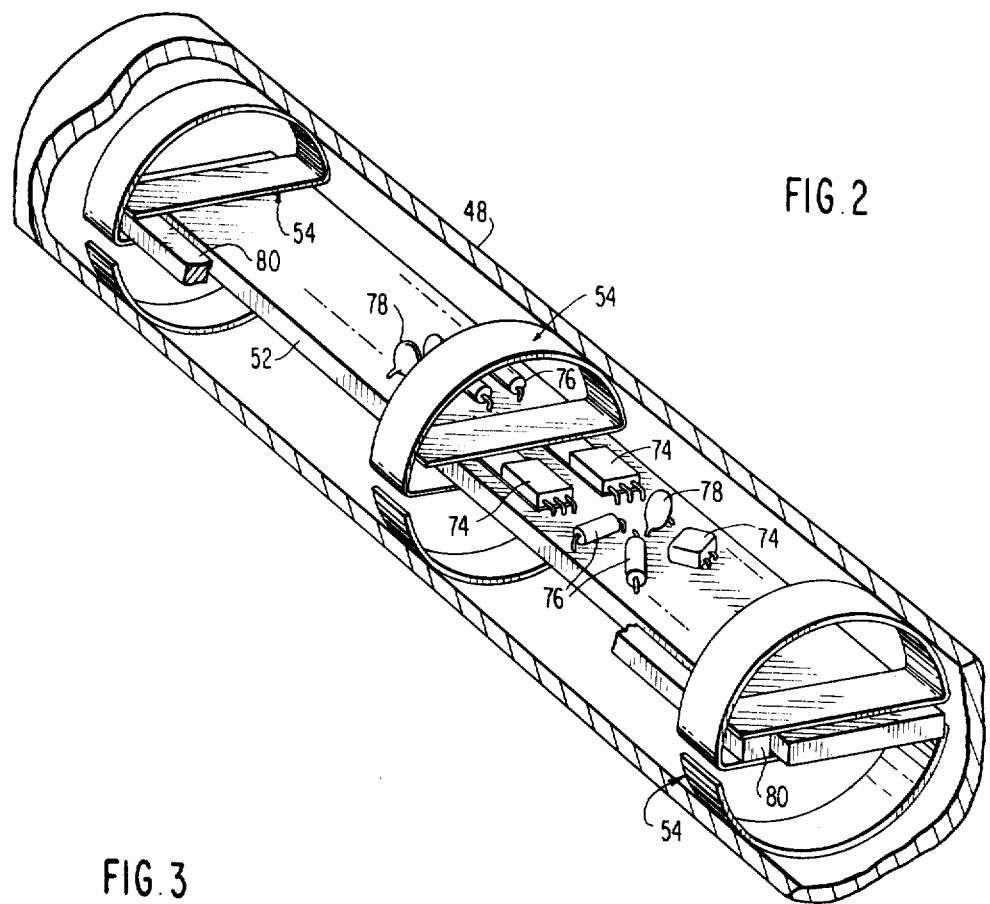
FIG. 2 is a cut away perspective view, showing a printed circuit board held by three heat sink/retainer clips according to a preferred embodiment of the invention.
Figure 3:
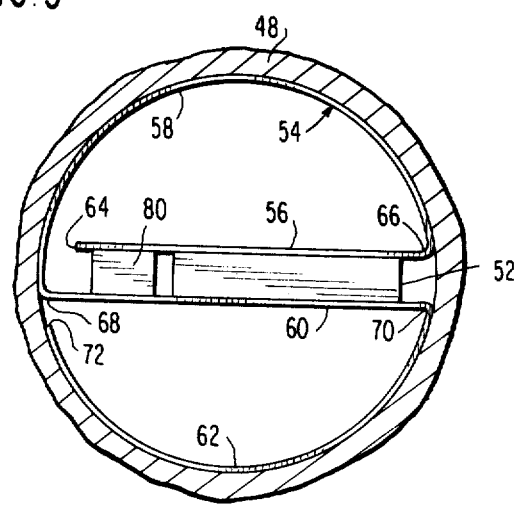
FIG. 3 is a front view of the assembly disclosed in FIG. 2.

Referring now to FIGS. 2 and 3 there will be seen a generally rectangular printed circuit board 52 retained in position within an electronics section 48 of the telemetering tool by three heat sink/retainer clips 54. As depicted in these figures the printed circuit board 52 has a rectangular cross-section and the electronics section of the telemetering tool 48 has a circular cross-section.

The retainer clips 54 comprise first portions 56, second portions 58, third portions 60, and fourth portions 62, all as described hereinafter. Since the three-illustrated retainer clips 54 are identical, only one will be described in detail.

The first portion 56 is shaped to extend partially across the circular cross-section of the electronics tubular member 48 from a first point 64 located interiorly of the tubular member 48 to a second point 66 located on the inner periphery of the tubular member 48. The first portion 56 serves as a gripping member.

The second portion 58 is serially connected to the first portion 56 at point 66. This section is shaped to extend partially around the inner periphery of the tubular member 48. This element serves as a positioning portion.

The third portion 60 is connected to the second portion 58 at point 68. It is shaped to extend across the circular cross-section of the tubular member 48 from the point 68 to a fourth point 70 located on the inner periphery of the tubular member 48. The third portion 60 is spaced from the first portion by a distance slightly less than the thickness of the printed circuit board 52. Accordingly, this portion serves in cooperation with element 56 as a gripping portion.

The fourth portion 62 is serially connected to the third portion 60 at point 70. It is shaped to extend partially around the inner periphery of the tubular member 48 from the point 70 to a fifth point 72 located on the inner periphery of the tubular member 48. The fourth portion 62 is also made of a resilient material and has a radius of curvature which is slightly greater than the inner radius of the tubular member 48. Accordingly, this member functions as a positioning portion.

As will be understood from the foregoing and from the drawings, when the printed circuit board 52 is placed between the first portion 56 and the third portion 60 and the retainer clip 54 is placed within the tubular member 48, contact of the outer peripheries of the second portion 58 and the fourth portion 62 with the inner periphery of the tubular member 48 causes the retainer clip 54 to distort, securely gripping the printed circuit board 52 between the first portion 56 and the third portion 60.

The heat sink retainer clip 54 is preferably formed by bending one continuous piece of resilient material having a uniform width and thickness. It will be appreciated that the word "resilient" is relative, and the actual degree of resiliency required is a function of the use to which the heat sink/retainer clip is to be put. In the presently preferred embodiment, the retainer clip 54 is made of beryllium copper because of its spring characteristics and heat transfer capability.

Where the object to be held by the heat sink/retainer clip has a rectangular cross-section (or, at least, two major parallel faces), as does the printed circuit board 52, it is desirable to make the first portion 56 and the third portion 60 straight and parallel to one another. However, it will be appreciated that the first portion 56 and the third portion 60 can have other shapes, particularly where the object to be held by the retainer clip does not have two major parallel faces.

In the specific environment for which this invention was developed (namely, for use in positioning printed circuit boards within a telemetering system, heat generating elements, such as the transistors 74 resistors 76, capacitators 78, etc., shown in FIG. 2, are often mounted on the object to be retained in place. It accordingly may be necessary to "heat sink" the heat generated by such elements—that is, to conduct the heat away from concentrated areas on the circuit boards. This can be accomplished with the subject invention in two ways.

First the retainer clip 54 functions both as a heat sink itself and as a heat conducting unit through which heat is conducted from the suspended object (in the illstrated case, from the printed circuit board 52) to the tubular package (in the illustrated embodiment, to the electronics section of the telemetering tool 48).

Second, a separate heat sink member, such as a heat sink bar 80 shown in the drawings, can be attached to or held between the first portion 56 and the second portion 60 adjacent to the heat generating elements. If desired, the heat sink 80 can also function as a transverse positioner and buffer for the suspended object.

Although it is contemplated that the object being suspended within the heat sink retainer clip and the heat sink retainer clip itself will both noramlly be held in place solely by the forces induced by distortion of the clip within the tubular package, it is of course possible to supplement those forces with a direct mechanical attachment between the object suspended and the heat sink/retainer clip, between the heat sink/retainer clip and the tubular package, or both. In particular, in environments where severe shock and/or vibration are anticipated, the heat sink/retainer clip may also be secured to the tubular package with rivets, bolts, screws, etc.

SUMMARY OF MAJOR ADVANTAGES OF THE INVENTION

Afer reviewing the foregoing description of a preferred embodiment of the invention, in conjunction with the drawings, it will be appreciated by those skilled in the art that several distinct advantages are obtained by the subject invention.

Without attempting to detail all of the desirable features specifically and inherently set forth above, a major advantage of the invention is that the subject heat sink/retainer clips dampen shock and vibration from the tubular package before such forces reach the suspended object.

A further advantage is that the clips transfer heat or cold from the suspended object to the tubular package—or, in appropriate circumstances, vice versa.

Another significant aspect of the subject invention is the ease in which rectangular objects may be securely mounted within a tubular object.

Still another advantage of a heat sink/retainer clip according to this invention is that it permits an object of arbitrary length to be secured in a tubular package, since as many individual clips as necessary may be utilized.

In describing the invention, reference has been made to a preferred embodiment. Those skilled in the art, however, and familiar with the disclosure of the subject invention, may recognize additions, deletions, modifications, substitutions and/or other changes which will fall within the purview of the subject invention as defined in the claims.

We claim:

1. A heat sink/retaining clip for resiliently retaining a first object within a second object having a circular cross-section, said clip comprising:
   a first portion dimensional to extend at least partially across the circular cross-section of the second object from a first point located interiorly of the second object to a second point located on the inner periphery of the second object;
   a second portion connected to said first portion at said second point and shaped to extend part way around the inner periphery of the second object from said second point to a third point located on the inner periphery of the second object,
   said second portion being made of a resilient material and having a radius of curvature which is slightly greater than the inner radius of the second object;
   a third portion connected to said second portion at said third point and dimensional to extend across the circular cross-section of the second object from said third point to a fourth point located on the inner periphery of the second object,
   said third portion being spaced from said first portion by a distance slightly less than the thickness of the first object; and
   a fourth portion connected to said third portion at said fourth point and shaped to extent part way around the inner periphery of the second object from said fourth point to a fifth point located on the inner periphery of the second object,
   said fourth portion being made of a resilient material and having a radius of curvature which is slightly greater than the inner radius of the second object, such that
   when the first object is placed between said first and third portions and said clip is placed within the second object, contact of the outer peripheries of said second and fourth portions with the inner periphery of the second object causes said clip to distort, grippping the first object between said first and third portions and supporting the first object within the second object.

2. A heat sink/retainer clip for resiliently retaining a first object within a second object as defined in claim 1 wherein:
   said first, second, third, and fourth portions are all made of one continuous strip of resilient material.

3. A heat sink/retainer for resiliently retaining a first object within a second object as defined in claim 1 wherein:
   said first, second, third, and fourth portions are of uniform width in a direction perpendicular to the circular cross-section of the second object.

4. A heat sink/retainer clip for resiliently retaining a first object within a second object as defined in claim 1 wherein:
   said first and third portions are straight and mutually parallel to one another.

5. A heat sink/retainer clip for resiliently retaining a first object within a second object as defined in claim 1 and further comprising:

a heat sink member in heat conducting contact with said first and third portions.

6. A heat sink/retainer clip for resiliently retaining a first object within a second object as defined in claim 5 wherein:
said heat sink is attached to said first and third portions.

7. A head sink/retainer clip for resiliently retaining an object within a tube having a circular cross-section, said clip comprising:
two gripping portions which extend at least partially across the tube from opposite sides thereof; and
two arcuate positioning portions which engage the inner periphery of the tube, said positioning portions being made of resilient materials and having outer radii of curvature which are slightly greater than the inner radius of the tube, said gripping portions and said arcuate positioning portions being serially connected to each other end to end and extending in substantially the same plane such that when the object is placed between said gripping portions and said heat sink/retaining clip is placed within the tube, contact of said positioning portions with the tube causes the clip to distort, gripping the object between said gripping portions.

8. A heat sink/retainer clip for resiliently retaining an object within a tube having a circular cross-section as defined in claim 7 wherein:
said gripping portions are straight and mutually parallel to one another.

9. A heat sink/retainer clip for resiliently retaining an object within a tube having a circular cross-section as defined in claim 7 wherein:
said gripping portions are of uniform width in the direction of the axis of the tube.

10. A heat sink/retainer clip for resiliently retaining an object within a tube having a circular cross-section as defined in claim 7 and further comprising:
a heat sink member in heat conducting contact with said gripping portions.

11. A heat sink/retainer clip for resiliently retaining an object within a tube having a circular cross-section as defined in claim 10 wherein:
said heat sink is attached to said gripping portions.

* * * * *